(12) United States Patent
Wang et al.

(10) Patent No.: US 11,195,897 B2
(45) Date of Patent: Dec. 7, 2021

(54) OLED ARRAY SUBSTRATE AND OLED DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Wei Wang, Wuhan (CN); Qing Huang, Wuhan (CN)

(*) Notice: Subject to any disclaimer, the term of this patent is extended or adjusted under 35 U.S.C. 154(b) by 117 days.

(21) Appl. No.: 16/496,439

(22) PCT Filed: Apr. 16, 2019

(86) PCT No.: PCT/CN2019/082859
§ 371 (c)(1),
(2) Date: Sep. 22, 2019

(87) PCT Pub. No.: WO2020/172966
PCT Pub. Date: Sep. 3, 2020

(65) Prior Publication Data
US 2021/0126075 A1    Apr. 29, 2021

(30) Foreign Application Priority Data
Feb. 28, 2019 (CN) .......................... 201910150785.3

(51) Int. Cl.
*H01L 29/08* (2006.01)
*H01L 27/32* (2006.01)
*H01L 27/12* (2006.01)

(52) U.S. Cl.
CPC ...... *H01L 27/3276* (2013.01); *H01L 27/3262* (2013.01); *H01L 27/3265* (2013.01); *H01L 27/1214* (2013.01)

(58) Field of Classification Search
CPC . H01L 27/32; H01L 27/3262; H01L 27/3265; H01L 27/1214; G09G 3/3233
See application file for complete search history.

(56) References Cited

U.S. PATENT DOCUMENTS

2009/0295422 A1* 12/2009 Hamer ................. G09G 3/3233
                                                                    324/760.02
2017/0301286 A1* 10/2017 Xiang .................. G09G 3/3233
2017/0309227 A1   10/2017 Ebisuno et al.
2018/0090072 A1*  3/2018 Sun ...................... G09G 3/3233

FOREIGN PATENT DOCUMENTS

CN            107369411 A      11/2017

* cited by examiner

*Primary Examiner* — Phuc T Dang

(57) ABSTRACT

An organic light-emitting diode (OLED) array substrate and an OLED display device are provided. The OLED array substrate includes a plurality of driving circuits of a plurality of sub-pixels using a mirror symmetrical structure, and a plurality of reset signal lines and a plurality of power signal lines extending along a same direction. By sharing each of the reset signal lines and each of a plurality of first vias, and sharing each of the power signal lines and each of a plurality of second vias, about half of lines of power signal lines, reset signal lines, and vias are saved. Therefore, room for increasing pixels per inch (PPI) is provided, facilitating realizing high PPI panel designs.

16 Claims, 2 Drawing Sheets

OLED ARRAY SUBSTRATE AND OLED DISPLAY DEVICE

FIELD OF INVENTION

The present disclosure relates to a technical field of displays, and more particularly to an organic light-emitting diode (OLED) array substrate and an OLED display device.

BACKGROUND OF INVENTION

Recently, rapid development of organic light emitting diode (OLED) display technologies has promoted fast entry of curved surface and flexible touch display products into the market. Relevant technologies also update with each passing day. OLEDs are diodes that use organic semiconductor material and light emitting material driven by electric fields to cause light emission through carrier injection and recombination. OLED display devices have advantages of being lightweight and self-luminous, and having large viewing angles, low driving voltage, high luminous efficiency, low power consumption, fast response speed, etc., thereby having a wider and wider application scope.

Active-matrix organic light emitting diode (AMOLED) display devices are display devices that use current-driven OLED devices to emit light to form images. In order to obtain better image uniformity, more accurate current control capability is required. Therefore, an external compensation method and an internal compensation method are commonly used to achieve the above effect. Internal compensation uses, for each sub-pixel, a circuit structure such as seven thin film transistors (TFTs) and one storage capacitor (7T1C), six TFTs and one storage capacitor (6T1C), or six TFTs and two storage capacitors (6T2C) to control output current of a driving switch.

Referring FIGS. 1A-1B, FIG. 1A is a schematic diagram of a layered structure of an existing OLED array substrate. FIG. 1B is a schematic diagram of a pixel structure of a 7T1C circuit corresponding to FIG. 1A.

Referring to FIG. 1A, the array substrate includes a substrate 111, a blocking layer (M/B) 112, a buffer layer (Buffer) 113, an active layer (Act) 114, a first gate insulating layer (G11) 115, a first gate electrode layer (GE1) 116, a second gate insulating layer (G12) 117, a second gate electrode layer (GE2) 118, a first interlayer dielectric layer (ILD1) 119, a second interlayer dielectric layer (ILD2) 120, a source or drain electrode layer (SD) 121, a planarization layer (PLN) 122, an anode (ANO) 123, an OLED 124, a pixel defined layer (PDL) 125, a photo spacer (PS) 126, a cathode 127, a thin film encapsulation (TFE) packaging layer 128, a polarization layer (POL) 129, and an external touch screen (TP) 130.

Referring to FIG. 1A in conjunction with FIG. 1B, the first gate electrode layer 116 includes a scan line Scan, and a gate electrode of a driving TFT M1 of a 7T1C circuit. The gate electrode of the driving TFT M1 also serves as a lower plate of a storage capacitor Cst of the 7T1C circuit. The second gate electrode layer 118 includes a reset signal line VI and an upper plate of the storage capacitor Cst. The source or drain electrode layer 121 includes a power signal line VDD and a data line Data. The reset signal line formed in the second gate electrode layer 118, and the power signal line formed in the source or drain electrode layer 121 extend along different directions (i.e., intersecting).

For the existing OLED array substrate, because a layout of 7T1C, 6T1C, or 6T2C components limit a size of each sub-pixel to be further reduced, increase in pixels per inch (PPI) is limited. The gate electrode of the driving TFT of the first gate electrode layer also serves as the lower plate of the storage capacitor, which is disadvantageous for a larger PPI circuit design. In a pixel structure, the reset signal line crosses the power signal line. A number of lines and a number of vias CNT are large, a density is high, and PPI is difficult to be further improved.

SUMMARY OF INVENTION

An object of the present disclosure is to provide, with respect to a problem of an existing technology, an organic light emitting diode (OLED) array substrate and an OLED display device, to facilitate designing a circuit of greater pixel density, increase image display uniformity, reduce coupling storage capacitance between lines, and form a larger storage capacitance.

In order to realize the foregoing object, an OLED array substrate is provided. The OLED array substrate includes: a plurality of sub-pixels, wherein each of the sub-pixels includes a driving circuit for controlling luminance and time of light emission of each of the sub-pixels, and wherein the OLED array substrate further includes: a plurality of reset signal lines and a plurality of power signal lines, wherein the reset signal lines and the power signal lines extend along a same direction, and wherein the driving circuits of the sub-pixels are arranged in a plurality of columns, wherein each two adjacent columns of the driving circuits of the sub-pixels use a mirror symmetrical structure, and wherein in each three adjacent columns of the sub-pixels, driving circuits of two sub-pixels in a same row of two adjacent columns of the sub-pixels share a corresponding reset signal line of the reset signal lines and a corresponding first via of a plurality of first vias, and driving circuits of two sub-pixels in a same row of the other two adjacent columns of the sub-pixels share a corresponding power signal line of the power signal lines and a corresponding second via of a plurality of second vias.

In order to realize the foregoing object, an OLED array substrate is provided. The OLED array substrate includes a plurality of sub-pixels, wherein each of the sub-pixels includes a driving circuit for controlling luminance and time of light emission of each of the sub-pixels, and wherein the driving circuits of the sub-pixels are arranged in a plurality of columns, wherein each two adjacent columns of the driving circuits of the sub-pixels use a mirror symmetrical structure.

In order to realize the foregoing object, an OLED display device is provided. The OLED display device includes: an OLED array substrate including: a plurality of sub-pixels, wherein each of the sub-pixels includes a driving circuit for controlling luminance and time of light emission of each of the sub-pixels, and wherein the driving circuits of the sub-pixels are arranged in a plurality of columns, wherein each two adjacent columns of the driving circuits of the sub-pixels use a mirror symmetrical structure.

Advantages of the present disclosure: The OLED array substrate includes a plurality of driving circuits of a plurality of sub-pixels using a mirror symmetrical structure, and a plurality of reset signal lines and a plurality of power signal lines extending along a same direction. By sharing each of the reset signal lines and each of a plurality of first vias, and sharing each of the power signal lines and each of a plurality of second vias, about half of lines of power signal lines, reset signal lines, and vias are saved. Therefore, room for increasing pixels per inch (PPI) is provided, facilitating realizing high PPI panel designs. A GE1/SD1/SD2 three-layer structure design is used for metal lines. GE1 serves as a gate electrode and a scan line of a driving TFT. SD1 serves as a source or drain electrode, a data line, a reset signal line, and a lower plate of the storage capacitor. SD2 serves as a power signal line and an upper plate of the storage capacitor. Therefore, a larger PPI circuit design is facilitated, and image display uniformity is increased.

DESCRIPTION OF DRAWINGS

In order to describe a technical solution in embodiments or existing technology more clearly, drawings required to be used by the embodiments are briefly introduced below. Obviously, the drawings in the description below are only some embodiments of the present disclosure. With respect to persons of ordinary skill in the art, under a premise that inventive efforts are not made, other drawings may be obtained based on these drawings.

DETAILED DESCRIPTION OF PREFERRED EMBODIMENTS

Figure 1A:
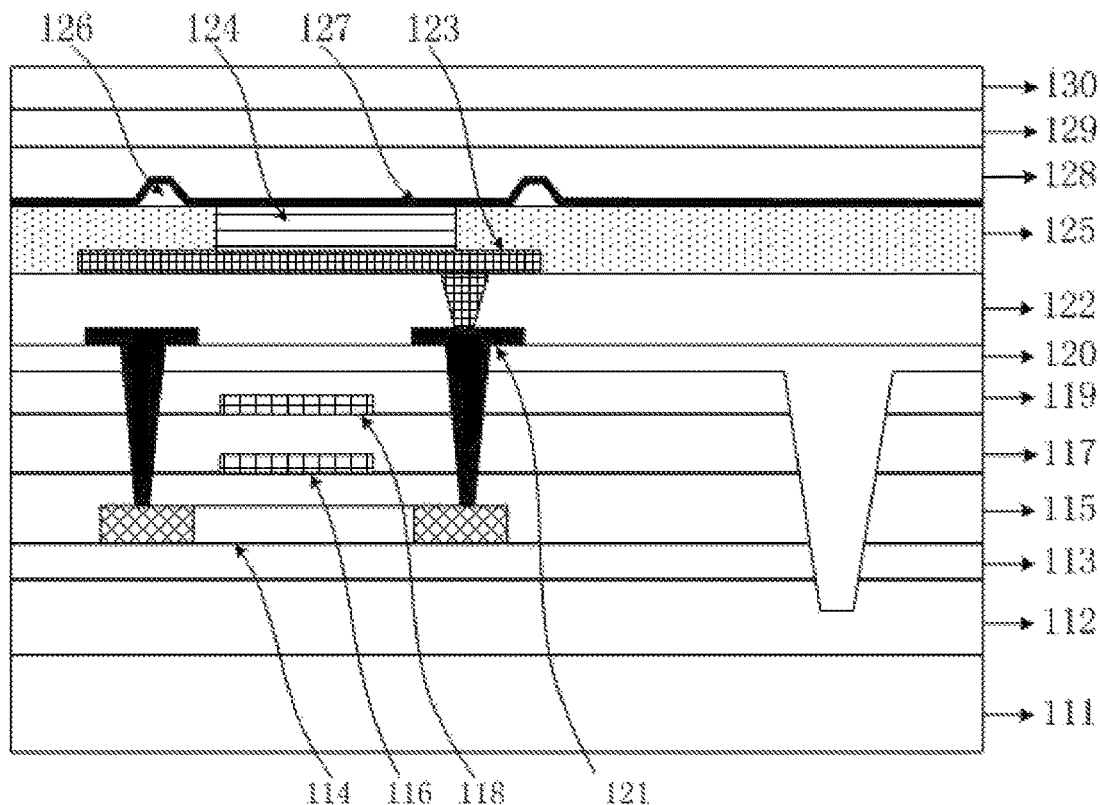
FIG. 1A is a schematic diagram of a layered structure of an existing OLED array substrate.
Figure 1B:
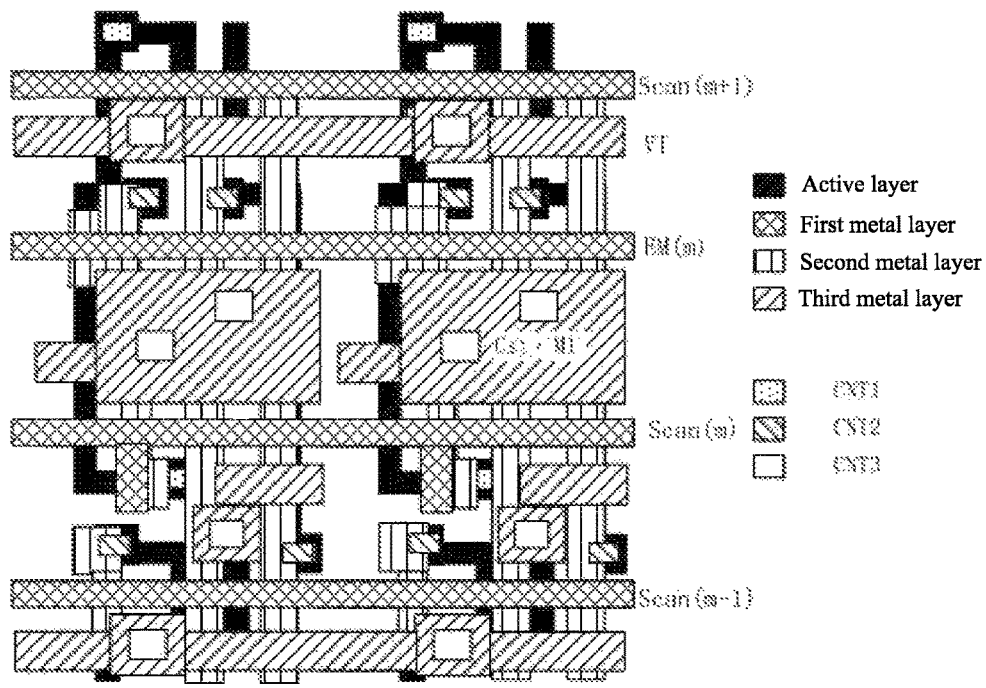
FIG. 1B is a schematic diagram of a pixel structure of a 7T1C circuit corresponding to FIG. 1A.

Embodiments of the present disclosure are described in detail below and examples of the embodiments are illustrated in the accompanying drawings, wherein same or similar labels throughout the present disclosure represent corresponding same or similar elements or corresponding elements having same or similar functions. The description of the embodiments with reference to the accompanying drawings below is exemplary, aims at illustrating the present disclosure, and cannot be considered as limitations to the present disclosure.

In the present disclosure, unless otherwise definitely specified and defined, when a first feature is "over" or "under" a second feature, the first feature may be directly in contact with the second feature, or the first feature and the second feature may not be directly in contact with each other and may be in contact through another feature between the first feature and the second feature. Furthermore, when the first feature is "over", "above", or "upper than" the second feature, the first feature may be directly above or obliquely above the second feature, or the phrase may merely mean that a level of the first feature is higher than a level of the second feature. When the first feature is "under", "below", or "lower than" the second feature, the first feature may be directly below or obliquely below the second feature, or the phrase may merely mean that a level of the first feature is lower than a level of the second feature.

The publication of the following description provides many different embodiments or examples for implementing different structures of the present disclosure. In order to simplify the publication of the present disclosure, in the following description, components and configurations of particular examples are described. Of course, they are only examples, and do not aim at limiting the present disclosure. In addition, the present disclosure may repeat reference numerals and/or reference letters in different examples. The repetition is for the purposes of simplicity and clarity, and the repetition itself does not indicate relationships between methods and/or configurations of various embodiments. Furthermore, the present disclosure provides various particular process and material examples, but those of ordinary skill in the art may think of application of other processes and/or use of other material.

An organic light-emitting diode (OLED) array substrate of the present disclosure includes a plurality of sub-pixels. Each of the sub-pixels includes a driving circuit for controlling luminance and time of light emission of each of the sub-pixels. The driving circuits of the sub-pixels are arranged in a plurality of columns. Each two adjacent columns of the driving circuits of the sub-pixels use a mirror symmetrical structure. Compared to the existing 7T1C layout structure, an improved layout structure of the present disclosure may provide room for increasing pixels per inch (PPI), facilitating realizing high PPI panel designs.

Preferably, driving circuits of two sub-pixels in a same row of two adjacent columns of the sub-pixels share a reset signal line and a first via (a reset via). An improved pixel structure layout may save half of lines of reset signal lines and vias. Therefore, room for increasing PPI is provided, facilitating realizing high PPI panel designs. For example, driving circuits of two sub-pixels (i.e., two sub-pixels adjacent to each other in a left-right direction) in a same row of a first column of the sub-pixels and a second column of the sub-pixels share a reset signal line and a reset via. Driving circuits of two sub-pixels correspondingly in a third column of the sub-pixels and a fourth column of the sub-pixels, and adjacent to each other in the left-right direction share a reset signal line and a reset via. The second column of the sub-pixels and the third column of the sub-pixels do not share a reset signal line and a reset via.

Preferably, driving circuits of two sub-pixels in a same row of two adjacent columns of the sub-pixels share a power signal line and a second via (a power via). An improved pixel structure layout may save half of lines of power signal lines and vias. Therefore, room for increasing PPI is provided, facilitating realizing high PPI panel designs. For example, driving circuits of two sub-pixels (i.e., two sub-pixels adjacent to each other in a left-right direction) in a same row of the second column of the sub-pixels and the third column of the sub-pixels share a power signal line and a power via. Driving circuits of two sub-pixels correspondingly in a fourth column of the sub-pixels and a fifth column of the sub-pixels, and adjacent to each other in the left-right direction share a power signal line and a power via. The first column of the sub-pixels and the second column of the sub-pixels, and the third column of the sub-pixels and the fourth column of the sub-pixels do not share a power signal line and a power via.

Preferably, the OLED array substrate further includes: a plurality of reset signal lines and a plurality of power signal lines. The reset signal lines and the power signal lines extend along a same direction (i.e., parallel). Preferably, in each three adjacent columns of the sub-pixels, driving circuits of two sub-pixels in a same row of two adjacent columns of the sub-pixels share a corresponding reset signal line of the reset signal lines and a corresponding first via of a plurality of first vias, and driving circuits of two sub-pixels in a same row of the other two adjacent columns of the sub-pixels share a corresponding power signal line of the power signal lines and a corresponding second via of a plurality of second vias. An improved pixel structure layout may save about half of lines of reset signal lines, power signal lines, and corresponding vias. Therefore, room for increasing PPI is provided, facilitating realizing high PPI panel designs.

Each of the sub-pixels of the OLED array substrate includes a plurality of thin film transistors (TFTs) (for example, a driving TFT and a switching TFT), and at least one storage capacitor Cst. The OLED array substrate further includes a first metal layer, a second metal layer, and a third metal layer. The first metal layer includes a scan line and a gate electrode of one of the TFTs. The second metal layer includes a data line, a reset signal line (VI, for resetting one of the at least one storage capacitor and an anode), source and drain electrodes of the one of the TFTs, and a lower plate of the one of the at least one storage capacitor. The third metal layer includes a power signal line (Vdd) and an upper plate of the one of the at least one storage capacitor. The power signal line is electrically connected to the upper plate of the one of the at least one storage capacitor. The first metal layer is a gate metal layer (GE1), the second metal layer is a first source or drain metal layer (SD1), and the third metal layer is a second source or drain metal layer (SD2). The upper and lower plates of the one of the at least one storage capacitor are formed using the second metal layer and the third metal layer. Only the gate electrode of the driving TFT and the scan line are formed in the first metal layer, facilitating a larger PPI circuit design.

Optionally, the reset signal line in the second metal layer and the power signal line in the third metal layer extend along a same direction to reduce a density of lines and a number of vias, increasing PPI.

Optionally, a plurality of power signal lines are in the third metal layer and includes the power signal line, and the power signal lines are electrically connected to each other in a horizontal direction to form a mesh structure. This structural design reduces voltage drops of the power signal lines without adding a photomask.

The OLED array substrate of the present disclosure uses a mirror symmetrical structure, and a plurality of reset signal lines and a plurality of power signal lines extending along a same direction. By sharing each of the reset signal lines and each of a plurality of first vias, and sharing each of the power signal lines and each of a plurality of second vias, about half of lines of power signal lines, reset signal lines, and vias are saved. Therefore, room for increasing PPI is provided, facilitating realizing high PPI panel designs. A GE1/SD1/SD2 three-layer structure design is used for metal lines. GE1 serves as a gate electrode and a scan line of a driving TFT. SD1 serves as a source or drain electrode, a data line, a reset signal line, and a lower plate of a storage capacitor. SD2 serves as a power signal line and an upper plate of the storage capacitor. Therefore, a larger PPI circuit design is facilitated, and image display uniformity is increased.

Figure 2:
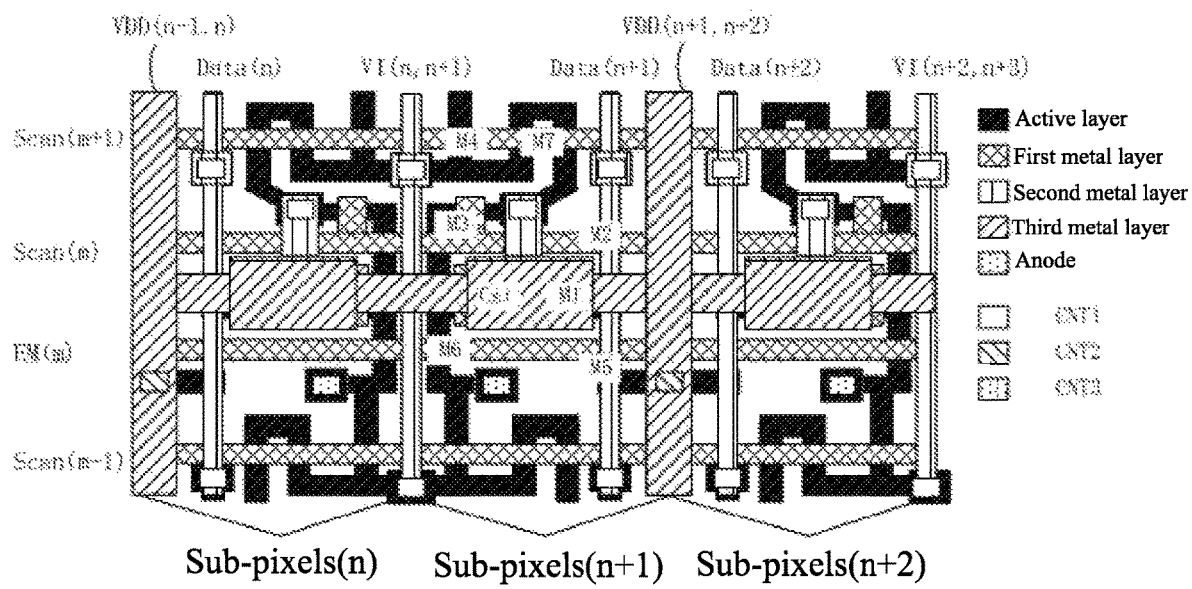
FIG. 2 is a schematic diagram of a pixel structure of an OLED array substrate in accordance with an embodiment of the present disclosure.

Referring FIG. 2, FIG. 2 is a schematic diagram of a pixel structure of an OLED array substrate in accordance with an embodiment of the present disclosure. In the figure, CNT1 is a contact, i.e., a first via, of an active layer (Poly) and a second metal layer (SD1). CNT2 is a contact, i.e., a second via, of an active layer (Poly), the second metal layer (SD1), and a third metal layer (SD2). CNT3 is a contact, i.e., a third via, of the third metal layer and anode metal (PE). The OLED array substrate includes a plurality of scan lines (labeled as Scan in the figure), a light emitting signal driving line (labeled as EM in the figure), a plurality of data lines (labeled as Data in the figure), a plurality of pixel portions formed by the scan lines Scan, the light emitting signal driving line EM, and the data lines Data, and a plurality of sub-pixels located at the corresponding pixel portions. Each of the sub-pixels includes a driving circuit for controlling luminance and time of light emission of each of the sub-pixels. The driving circuits of the sub-pixels are arranged in a plurality of columns. In the present embodiment, the driving circuit of each of the sub-pixels is a 7T1C circuit and includes 7 TFTs M1-M7 and a storage capacitor Cst. The TFT M1 is a driving TFT.

Each two adjacent columns of the driving circuits of the sub-pixels use a mirror symmetrical structure. In FIG. 2, driving circuits of sub-pixels(n) and driving circuits of sub-pixels(n+1) are mirror-symmetrical, and driving circuits of sub-pixels(n+1) and driving circuits of sub-pixels(n+2) are mirror-symmetrical.

Driving circuits of two sub-pixels in a same row of two adjacent columns of the sub-pixels share a reset signal line (labeled as VI in the figure) and a first via CNT1. As illustrated in FIG. 2, driving circuits of two sub-pixels in a same row of the sub-pixels(n) and the sub-pixels(n+1) share a reset signal line VI(n, n+1) and a first via CNT1.

Driving circuits of two sub-pixels in a same row of two adjacent columns of the sub-pixels share a power signal line (labeled as VDD in the figure) and a second via CNT2. As illustrated in FIG. 2, driving circuits of two sub-pixels in a same row of the sub-pixels(n+1) and the sub-pixels(n+2) share a power signal line VDD(n+1, n+2) and a second via CNT2.

That is, in each three adjacent columns of the sub-pixels, driving circuits of two sub-pixels in a same row of two adjacent columns of the sub-pixels share a corresponding reset signal line of the reset signal lines and a corresponding first via of a plurality of first vias, and driving circuits of two sub-pixels in a same row of the other two adjacent columns of the sub-pixels share a corresponding power signal line of the power signal lines and a corresponding second via of a plurality of second vias. As illustrated in FIG. 2, in each three adjacent columns of the sub-pixels (the sub-pixels(n), the sub-pixels(n+1), and the sub-pixels(n+2)), driving circuits of two sub-pixels in a same row of two adjacent columns of the sub-pixels (the sub-pixels(n) and the sub-pixels(n+1)) share a corresponding reset signal line VI(n, n+1) of the reset signal lines and a corresponding first via of a plurality of first vias CNT1, and driving circuits of two sub-pixels (the sub-pixels(n+1) and the sub-pixels(n+2)) in a same row of the other two adjacent columns of the sub-pixels share a corresponding power signal line VDD(n+1, n+2) of the power signal lines and a corresponding second via of a plurality of second vias CNT2.

The OLED array substrate further includes a plurality of reset signal lines and a plurality of power signal lines. The reset signal lines VI and the power signal lines VDD extend along a same direction (i.e., parallel). Therefore, in each three adjacent columns of the sub-pixels, the first two sub-pixels share a corresponding reset signal line of the reset signal lines VI and a corresponding first via of a plurality of first vias CNT1. The latter two sub-pixels share a corresponding power signal line of the power signal lines VDD and a corresponding second via of a plurality of second vias CNT2. As illustrated in FIG. 2, the sub-pixels(n) and the sub-pixels(n+1) share the reset signal line VI(n, n+1) and the first via CNT1. The sub-pixels(n+1) and the sub-pixels(n+2) share the power signal line VDD(n+1, n+2) and the second via CNT2.

Compared to the existing 7T1C layout structure, an improved layout structure of the present disclosure saves about half of lines of power signal lines, reset signal lines, and vias. Therefore, room for increasing PPI is provided, facilitating realizing high PPI panel designs.

Figure 3:
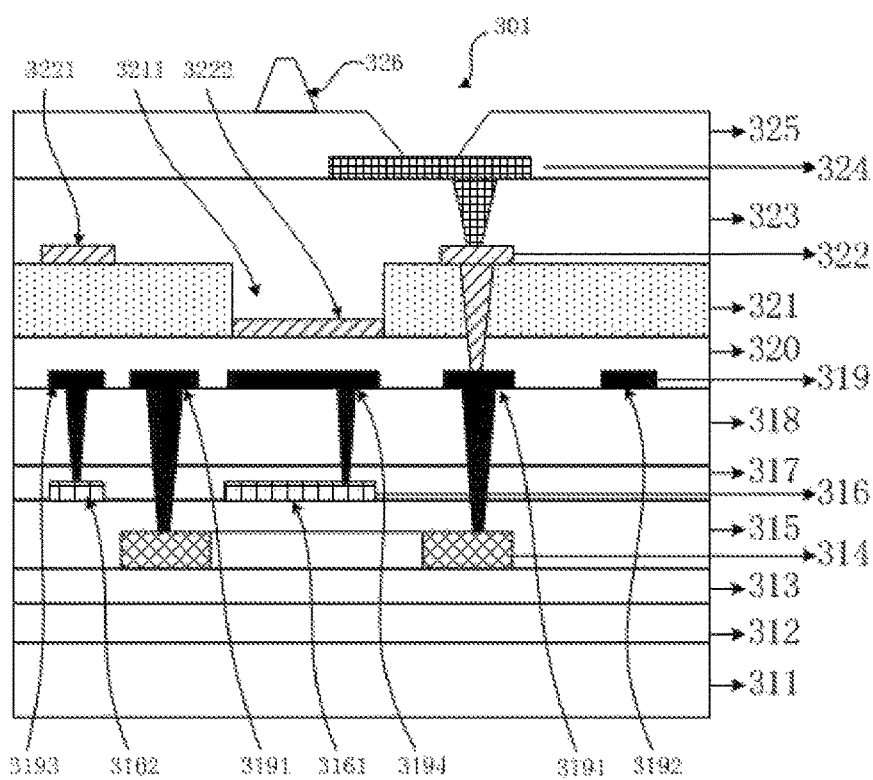
FIG. 3 is a schematic diagram of a layered structure of an OLED array substrate in accordance with an embodiment of the present disclosure.

Referring to FIG. 3, FIG. 3 is a schematic diagram of a layered structure of an OLED array substrate in accordance with an embodiment of the present disclosure. An array substrate of the present disclosure includes an active area 301, a fanout area, and a pad bending area (an external circuit area, which is not illustrated in the figure). The display area 301 includes a plurality of TFTs and at least one storage capacitor Cst of a driving circuit of a sub-pixel of the array substrate. Specifically, the array substrate includes: a substrate 311, and a blocking layer (M/B) 312, a buffer layer (Buffer) 313, an active layer 314, a first gate insulating layer (G11) 315, a first gate metal layer (GE1) 316, a first passivation layer (PV1) 317, an organic interlayer dielectric layer (OILD) 318, a first source or drain metal layer (SD1) 319, a second passivation layer (PV2) 320, a first planarization layer (PLN1) 321, a second source or drain metal layer (SD2) 322, a second planarization layer (PLN2) 323, an anode (ANO) 324, a pixel defined layer (PDL) 325, and a photo spacer (PS) 326, which are sequentially disposed on the substrate 311. The substrate 311 may be a glass substrate or an organic substrate formed using colorless transparent polyimide (PI) material. The substrate 311 may be a single-layer substrate or a double-layer substrate.

Specifically, the first gate metal layer 316 includes a gate electrode 3161 of one of the TFTs and a scan line 3162. The first passivation layer 317 is an inorganic insulating layer covering the first metal layer 316. The organic interlayer dielectric layer 318 is an organic insulating layer formed on the first passivation layer 317. That is, an inorganic insulating layer and an organic insulating layer are formed between the first gate metal layer 316 and the first source or drain metal layer 319, thereby reducing coupling effect between two layers of lines.

Specifically, the first source or drain metal layer 319 includes source and drain electrodes (S/D) 3191 of the one of the TFTs, a data line 3192, a reset signal line (VI) 3193, and a lower plate 3194 of one of at least one storage capacitor. The second passivation layer 320 is an inorganic insulating layer covering the first source or drain metal layer 319. The first planarization layer 321 is an organic insulating layer formed on the second passivation layer 320. That is, an inorganic insulating layer and an organic insulating layer are present above the data line 3192 in the first source or drain metal layer 319, so that coupling capacitance of the data line and the power signal line may be reduced. In a storage capacitor area, a thickness of a dielectric insulating layer of the one of the at least one storage capacitor may be reduced by reducing a thickness of the first planarization layer 321 using an exposure process. In this way, a larger storage capacitance may be formed, and at the same time, an unaffected thickness of the organic insulating layer in another area is ensured.

Specifically, the second source or drain metal layer 322 includes a power signal line 3221 and an upper plate 3222 of the one of the at least one storage capacitor. The power signal line 3221 is electrically connected to the upper plate 3222 of the one of the at least one storage capacitor (a connecting relationship is not illustrated in the figure). The power signal line 3221 and the reset signal line 3193 extend along a same direction to reduce a density of lines and a number of vias, facilitating a larger PPI circuit design and increasing image display uniformity. The second planarization layer 323 (an organic insulating layer) covers the second source or drain metal layer 322. Then, anode metal (PE) may be deposited and patterned to form the anode 324.

Optionally, a plurality of power signal lines are in the second source or drain metal layer 322 and includes the power signal line 3221, and the power signal lines are electrically connected to each other in a horizontal direction to form a mesh structure. This structural design reduces voltage drops of the power signal lines without adding a photomask.

The upper and lower plates of the one of the at least one storage capacitor are formed using the first source or drain metal layer 319 and the second source or drain metal layer 322. Only the gate electrode of the driving TFT and the scan line are formed in the first gate metal layer 316, facilitating a larger PPI circuit design. At the same time, an inorganic insulating layer and an organic insulating layer are formed between two layers of the source or drain metal layers, thereby reducing coupling effect between two layers of lines. A thickness of the dielectric insulating layer in the storage capacitor area may be reduced using an exposure process to achieve an object of increasing storage capacitance.

Preferably, in the present embodiment, a trench 3211 is formed in the first planarization layer 321 at a corresponding position of the lower plate 3194 of the one of the at least one storage capacitor. The upper plate 3222 of the one of the at least one storage capacitor is formed in the trench 3211. That is, the dielectric insulating layer of the one of the at least one storage capacitor is formed by the first planarization layer 321 remaining under the trench 3211 and the second passivation layer 320. A depth of the trench 3211 may be adjusted using a half-tone mask process during a process that the first planarization layer 321 is partially exposed. Therefore, an amount of the storage capacitance may be adjusted by adjusting an overlapping area of the upper and lower plates and the depth of the trench 3211.

The present disclosure provides an OLED display device. The OLED display device includes the aforementioned OLED array substrate of the present disclosure. In the OLED display device of the present disclosure, the OLED array substrate uses a mirror symmetrical structure, and a plurality of reset signal lines and a plurality of power signal lines extending along a same direction. By sharing each of the reset signal lines and each of a plurality of first vias, and sharing each of the power signal lines and each of a plurality of second vias, about half of lines of power signal lines, reset signal lines, and vias are saved. Therefore, room for increasing PPI is provided, facilitating realizing high PPI panel designs. A GE1/SD1/SD2 three-layer structure design is used for metal lines of the OLED array substrate. GE1 serves as a gate electrode and a scan line of a driving TFT. SD1 serves as a source or drain electrode, a data line, a reset signal line, and a lower plate of a storage capacitor. SD2 serves as a power signal line and an upper plate of the storage capacitor. Therefore, a larger PPI circuit design is facilitated, and image display uniformity is increased.

INDUSTRIAL UTILITY

The subject matter of the present application may be manufactured and used in industry, and satisfies the industrial utility requirement.

What is claimed is:

1. An organic light-emitting diode (OLED) array substrate, comprising:
a plurality of sub-pixels, wherein each of the sub-pixels comprises a driving circuit for controlling luminance and time of light emission of each of the sub-pixels, and wherein the OLED array substrate further comprises:
a plurality of reset signal lines and a plurality of power signal lines, wherein the reset signal lines and the power signal lines extend along a same direction, and wherein the driving circuits of the sub-pixels are arranged in a plurality of columns, wherein each two adjacent columns of the driving circuits of the sub-pixels use a mirror symmetrical structure, and wherein in each three adjacent columns of the sub-pixels, driving circuits of two sub-pixels in a same row of two adjacent columns of the sub-pixels share a corresponding reset signal line of the reset signal lines and a corresponding first via of a plurality of first vias, and driving circuits of two sub-pixels in a same row of the other two adjacent columns of the sub-pixels share a corresponding power signal line of the power signal lines and a corresponding second via of a plurality of second vias.

2. The OLED array substrate of claim 1, wherein each of the driving circuits of the sub-pixels comprises a plurality of thin film transistors (TFTs) and at least one storage capacitor, and wherein the OLED array substrate further comprises:
   a first metal layer comprising a scan line, and a gate electrode of one of the TFTs;
   a second metal layer comprising a data line, a reset signal line, source and drain electrodes of the one of the TFTs, and a lower plate of one of the at least one storage capacitor; and
   a third metal layer comprising a power signal line and an upper plate of the one of the at least one storage capacitor, wherein the power signal line is electrically connected to the upper plate of the one of the at least one storage capacitor.

3. An organic light-emitting diode (OLED) array substrate, comprising: a plurality of sub-pixels, wherein each of the sub-pixels comprises a driving circuit for controlling luminance and time of light emission of each of the sub-pixels, and wherein the driving circuits of the sub-pixels are arranged in a plurality of columns, wherein each two adjacent columns of the driving circuits of the sub-pixels use a mirror symmetrical structure; and
   a plurality of reset signal lines and a plurality of power signal lines, wherein the reset signal lines and the power signal lines extend along a same direction.

4. The OLED array substrate of claim 3, wherein driving circuits of two sub-pixels in a same row of two adjacent columns of the sub-pixels share a corresponding reset signal line of the reset signal lines and a first via.

5. The OLED array substrate of claim 3, wherein driving circuits of two sub-pixels in a same row of two adjacent columns of the sub-pixels share a corresponding power signal line of the power signal lines and a second via.

6. The OLED array substrate of claim 3, wherein in each three adjacent columns of the sub-pixels, driving circuits of two sub-pixels in a same row of two adjacent columns of the sub-pixels share a corresponding reset signal line of the reset signal lines and a corresponding first via of a plurality of first vias, and driving circuits of two sub-pixels in a same row of the other two adjacent columns of the sub-pixels share a corresponding power signal line of the power signal lines and a corresponding second via of a plurality of second vias.

7. The OLED array substrate of claim 3, wherein each of the driving circuits of the sub-pixels comprises a plurality of thin film transistors (TFTs) and at least one storage capacitor, and wherein the OLED array substrate further comprises:
   a first metal layer comprising a scan line, and a gate electrode of one of the TFTs;
   a second metal layer comprising a data line, a corresponding reset signal line of the reset signal lines, source and drain electrodes of the one of the TFTs, and a lower plate of one of the at least one storage capacitor; and
   a third metal layer comprising a corresponding power signal line of the power signal lines and an upper plate of the one of the at least one storage capacitor, wherein the corresponding power signal line of the power signal lines is electrically connected to the upper plate of the one of the at least one storage capacitor.

8. The OLED array substrate of claim 7, wherein the power signal lines are in the third metal layer and comprise the corresponding power signal line, and the power signal lines are electrically connected to each other in a horizontal direction to form a mesh structure.

9. The OLED array substrate of claim 7, wherein the first metal layer is a gate metal layer, the second metal layer is a first source or drain metal layer, and the third metal layer is a second source or drain metal layer.

10. An organic light-emitting diode (OLED) display device, comprising:
    an OLED array substrate comprising:
    a plurality of sub-pixels, wherein each of the sub-pixels comprises a driving circuit for controlling luminance and time of light emission of each of the sub-pixels, and wherein the driving circuits of the sub-pixels are arranged in a plurality of columns, wherein each two adjacent columns of the driving circuits of the sub-pixels use a mirror symmetrical structure; and
    a plurality of reset signal lines and a plurality of power signal lines, wherein the reset signal lines and the power signal lines extend along a same direction.

11. The OLED display device of claim 10, wherein driving circuits of two sub-pixels in a same row of two adjacent columns of the sub-pixels share a corresponding reset signal line of the reset signal lines and a first via.

12. The OLED display device of claim 10, wherein driving circuits of two sub-pixels in a same row of two adjacent columns of the sub-pixels share a corresponding power signal line of the power signal lines and a second via.

13. The OLED display device of claim 10, wherein in each three adjacent columns of the sub-pixels, driving circuits of two sub-pixels in a same row of two adjacent columns of the sub-pixels share a corresponding reset signal line of the reset signal lines and a corresponding first via of a plurality of first vias, and driving circuits of two sub-pixels in a same row of the other two adjacent columns of the sub-pixels share a corresponding power signal line of the power signal lines and a corresponding second via of a plurality of second vias.

14. The OLED display device of claim 10, wherein each of the driving circuits of the sub-pixels comprises a plurality of thin film transistors (TFTs) and at least one storage capacitor, and wherein the OLED array substrate further comprises:
    a first metal layer comprising a scan line, and a gate electrode of one of the TFTs;
    a second metal layer comprising a data line, a corresponding reset signal line of the reset signal lines, source and drain electrodes of the one of the TFTs, and a lower plate of one of the at least one storage capacitor; and
    a third metal layer comprising a corresponding power signal line of the power signal lines and an upper plate of the one of the at least one storage capacitor, wherein the corresponding power signal line of the power signal lines is electrically connected to the upper plate of the one of the at least one storage capacitor.

15. The OLED display device of claim 14, wherein the power signal lines are in the third metal layer and comprise the corresponding power signal line, and the power signal lines are electrically connected to each other in a horizontal direction to form a mesh structure.

16. The OLED display device of claim 14, wherein the first metal layer is a gate metal layer, the second metal layer is a first source or drain metal layer, and the third metal layer is a second source or drain metal layer.

\* \* \* \* \*